(12) United States Patent
Shimoosako et al.

(10) Patent No.: US 12,309,919 B2
(45) Date of Patent: May 20, 2025

(54) LAMINATE, SINGLE-SIDED METAL-CLAD LAMINATED SHEET, AND MULTI-LAYER PRINTED WIRING BOARD

(71) Applicant: KANEKA CORPORATION, Osaka (JP)

(72) Inventors: Kanji Shimoosako, Otsu (JP); Kentaro Tsukuya, Otsu (JP); Hitoshi Yasuhira, Otsu (JP); Konoshin Fujimoto, Otsu (JP)

(73) Assignee: KANEKA CORPORATION, Osaka (JP)

( * ) Notice: Subject to any disclaimer, the term of this patent is extended or adjusted under 35 U.S.C. 154(b) by 147 days.

(21) Appl. No.: 18/063,666

(22) Filed: Dec. 8, 2022

(65) Prior Publication Data

US 2023/0106839 A1    Apr. 6, 2023

Related U.S. Application Data

(63) Continuation of application No. PCT/JP2021/020857, filed on Jun. 1, 2021.

(30) Foreign Application Priority Data

Jun. 8, 2020    (JP) ................. 2020-099350

(51) Int. Cl.
*H05K 1/03*    (2006.01)

(52) U.S. Cl.
CPC ......... *H05K 1/036* (2013.01); *H05K 1/0393* (2013.01); *H05K 2201/0129* (2013.01); *H05K 2201/0154* (2013.01); *H05K 2201/0355* (2013.01)

(58) Field of Classification Search
CPC ............................. H05K 1/036; H05K 1/0393
See application file for complete search history.

(56) References Cited

U.S. PATENT DOCUMENTS

2015/0367606 A1* 12/2015  Huang ................... B05D 7/582
                                                                    156/60
2018/0178458 A1   6/2018  Yamaoka
2021/0348276 A1   11/2021 Nakamura et al.

FOREIGN PATENT DOCUMENTS

JP    H08-204053 A    8/1996
JP    2001-179911 A   7/2001
(Continued)

OTHER PUBLICATIONS

International Search Report issued in corresponding International Application No. PCT/JP2021/020857 mailed Sep. 7, 2021, with translation (7 pages).

(Continued)

*Primary Examiner* — Jeremy C Norris
(74) *Attorney, Agent, or Firm* — Osha Bergman Watanabe & Burton LLP (57) ABSTRACT

The laminate includes a multilayer polyimide film having thermoplastic polyimide layers on both sides of a core layer which is a non-thermoplastic polyimide film and a surface layer contacting the thermoplastic polyimide layer on one surface-side of the multilayer polyimide film. The surface layer may be an inorganic layer having a thickness of 1 to 200 nm or a resin layer having a thickness of 0.1 to 5 μm. A single-sided metal-clad laminate is formed by laminating a metal layer on the thermoplastic resin layer on the surface layer non-formed surface of the laminate.

17 Claims, 1 Drawing Sheet

(56) References Cited

FOREIGN PATENT DOCUMENTS

| | | | |
|---|---|---|---|
| JP | 2002-280684 | A | 9/2002 |
| JP | 2007-109694 | A | 4/2007 |
| JP | 2013-176931 | A | 9/2013 |
| JP | 2017-205948 | A | 11/2017 |
| WO | 2016/208730 | A1 | 12/2016 |
| WO | 2020/050338 | A1 | 3/2020 |

OTHER PUBLICATIONS

Written Opinion issued in corresponding International Application No. PCT/JP2021/020857 mailed Sep. 7, 2021 (4 pages).
International Preliminary Report on Patentability issued in corresponding International Application No. PCT/JP2021/020857, mailed Dec. 22, 2022 (6 pages).

* cited by examiner

LAMINATE, SINGLE-SIDED METAL-CLAD LAMINATED SHEET, AND MULTI-LAYER PRINTED WIRING BOARD

TECHNICAL FIELD

One or more embodiments of the present invention relate to a laminate including a surface layer on one surface of a multi-layer polyimide film, and a single-sided metal-clad laminate. Furthermore, one or more embodiments of the present invention relate to a multi-layer printed wiring board produced by use of the single-sided metal-clad laminate.

BACKGROUND

Various printed wiring boards are used for electronic devices. A printed wiring board includes metal wiring in which a metal layer of copper or the like is patterned on an insulating substrate. A flexible printed wiring board (FPC) in which a heat-resistant resin film such as a polyimide film is used as an insulating substrate has been put into practical use. Enhanced performance and miniaturization of electronic devices have promoted development of multi-layer flexible printed wiring boards in which a plurality of wiring layers are laminated with insulating layers interposed between the wiring layers, thereby forming a multi-layer.

For production of FPC, a double-sided metal-clad laminate in which a metal foil of copper or the like is laminated on both front and rear surfaces of a polyimide film, or a single-sided metal-clad laminate in which a metal foil is laminated on one surface of a polyimide film is used. As a method for producing a double-sided metal-clad laminate, a method is known in a metal foil is laminated on both surfaces of a multi-layer polyimide film by thermal lamination, the multi-layer polyimide film including a thermoplastic resin layer functioning as an adhesive layer on both surfaces of a non-thermoplastic polyimide film (core layer).

When the double-sided metal-clad laminates are stacked to form a multi-layer in production of a multi-layer flexible printed wiring board, the laminates are integrated such that the metal foils contact each other. Therefore, single-sided metal-clad laminates are mainly used for production of multi-layer FPC. A metal foil (metal layer) of the single-sided metal-clad laminate is patterned to form wiring, and a substrate including a wiring layer on one surface of a polyimide film as an insulating layer is laminated with an adhesive sheet such as a bonding sheet to form a multi-layer.

If a single-sided metal-clad laminate is formed by laminating a metal foil on one surface of a multi-layer polyimide film including a thermoplastic resin layer on both surfaces of a core layer, a thermoplastic resin layer on a surface where the metal foil is not provided may be fused to a heat roll or the like during lamination and in the production process of a printed wiring board.

Patent Document 1 indicates that in production of a single-sided metal-clad laminate in which a metal foil is laminated on one surface of a multi-layer polyimide film including a thermoplastic resin layer on both surfaces of a core layer, fusion to a metal roll or the like can be prevented when a polyimide having a specific structure is used as a material for a thermoplastic resin layer on a surface where the metal foil is not laminated. Patent Document 2 proposes a method in which a single-sided metal-clad laminate is produced by performing thermal lamination with a metal foil disposed on one surface of a multi-layer polyimide film and a release film disposed on the other surface.

PATENT DOCUMENTS

Patent Document 1: Japanese Patent Laid-Open Publication No. 2013-176931
Patent Document 2: Japanese Patent Laid-Open Publication No. 2007-109694

In a multi-layer polyimide film including thermoplastic polyimide layers having different compositions on the front and rear of a core layer as in Patent Document 1, the multi-layer polyimide film itself or a single-sided metal-clad laminate in which a metal foil is laminated on one surface may be warped due to a difference in behavior of change in size by heating (e.g. thermal expansion coefficient) between the thermoplastic resin layers on the front and rear, etc.

As proposed in Patent Document 2, temporary lamination of a metal foil on a surface where a metal foil is not laminated enables prevention of fusion of a thermoplastic resin to a heat roll or the like during thermal lamination of the metal foil onto a multi-layer polyimide film. However, when the release film is bonded, a single-sided metal-clad laminate may be warped due to a difference in stress balance between the front and the rear, etc. In addition, the thermoplastic resin layer may be fused in the process because the release film is peeled off to expose the thermoplastic resin layer in production of a printed wiring board using a single-sided metal-clad laminate.

In the production process of a multi-layer printed wiring board, boring is performed by punching, mechanical drilling, laser processing or the like before and after formation of a multi-layer for the purpose of, for example, conduction of metal wirings. When the thermoplastic resin layer of the multi-layer polyimide film is exposed or the bonding sheet is directly bonded to the thermoplastic resin layer, during boring, processing failure may occur or it may be difficult to remove cut pieces.

SUMMARY

In view of the above-described circumstances, one or more embodiments of the present invention provide a laminate which is used as a film substrate of a single-sided metal-clad laminate and which is capable of suppressing problems related to a thermoplastic resin layer of a metal foil-non-laminated surface, such as fusion, and suppressing occurrence of warpage in the production process of a single-sided metal-clad laminate and multi-layer printed wiring board.

One or more embodiments of the present invention are a laminate including a surface layer on one surface of a multi-layer polyimide film. A metal layer is laminated to a surface layer-non-formed surface of the laminate to form a single-sided metal-clad laminate.

The multi-layer polyimide film includes thermoplastic polyimide layers on both surfaces of a core layer that is a non-thermoplastic polyimide film. The thermoplastic polyimide layers disposed on the front and the rear of the core layer may have the same composition. In the laminate, the surface layer is in contact with the thermoplastic polyimide layer on one surface of the multi-layer polyimide film. The surface layer may be an inorganic layer or an organic layer (resin layer).

When the surface layer is an inorganic layer, the material thereof may be a ceramic material such as silicon oxide. The thickness of the inorganic surface layer may be 1 to 200 nm.

When the surface layer is a resin layer, the thickness thereof may be 0.1 to 5 μm. Examples of the resin material of the resin surface layer include thermoplastic or non-thermoplastic resin materials. When the resin surface layer is a thermoplastic resin layer, it is preferable that the resin surface layer has a higher glass transition temperature over the thermoplastic resin layer of the multi-layer polyimide film. The resin material may be polyimide. The resin material may be a thermosetting resin such as an epoxy resin.

The single-sided metal-clad laminate is used for forming a flexible printed wiring board. The printed wiring board may be a multi-layer printed wiring board in which a plurality of wiring layers are laminated with insulating layers interposed between the wiring layers. The metal layer of the single-sided metal-clad laminate is patterned to form a wiring layer, and the surface layer (metal layer-non-formed surface) of the substrate is bonded to a wiring layer of another substrate to form a multi-layer. The surface layer and the wiring layer of the other substrate may be bonded to each other with an adhesive sheet such as a bonding sheet interposed therebetween.

A single-sided metal-clad laminate including a metal layer on one surface of a multi-layer polyimide film and the surface layer on the other surface is less likely to be warped. In addition, since the surface layer is disposed on the thermoplastic resin layer of the multi-layer polyimide film, it is possible to suppress a problem caused by fusion of the thermoplastic resin layer, or the like, not only during lamination of the metal layer to the multi-layer polyimide film but also in the production process of the printed wiring board.

DETAILED DESCRIPTION

Figure 1:
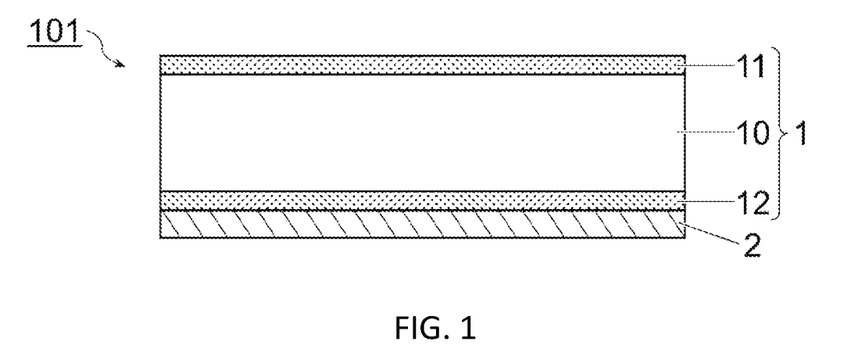
FIG. 1 is a sectional view of a laminate according to one or more embodiments.

FIG. 1 is a sectional view of a laminate according to one or more embodiments of the present invention, in which a surface layer 2 is disposed on one surface of a multi-layer polyimide film 1. The multi-layer polyimide film 1 includes thermoplastic resin layers 11 and 12 on both surfaces of a core layer 10. A laminate 101 includes the surface layer 2 that is in contact with the thermoplastic resin layer 12 of the multi-layer polyimide film 1.

Figure 2:
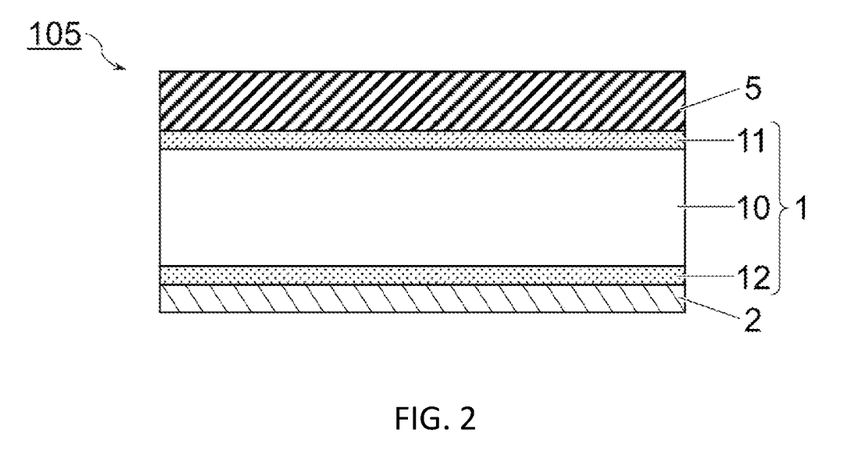
FIG. 2 is a sectional view of a single-sided metal-clad laminate according to one or more embodiments.

FIG. 2 is a sectional view of a single-sided metal-clad laminate according to one or more embodiments of the present invention, in which a metal layer 5 is laminated on the thermoplastic resin layer 11 of the laminate 101. In other words, a single-sided metal-clad laminate 105 includes the metal layer 5 on the thermoplastic resin layer 11 on one surface of the multi-layer polyimide film 1, and the surface layer 2 on the thermoplastic resin layer 12 on the other surface (surface where metal layer 5 is not laminated) of the multi-layer polyimide film 1.

Configuration of Laminate

Multi-Layer Polyimide Film

The laminate 101 according to one or more embodiments of the present invention is a film substrate used for formation of a single-sided metal-clad laminate. The laminate 101 includes the surface layer 2 on a metal layer-non-formed surface of a multi-layer polyimide film 1. The multi-layer polyimide film 1 has a three-layer configuration in which thermoplastic resin layers 11 and 12 are disposed on both surfaces of the core layer 10 of non-thermoplastic polyimide.

(Core Layer)

The core layer 10 is required to be usable at a heating temperature during thermal lamination in the production process of a printed wiring board. Therefore, a polyimide having no thermoplasticity (non-thermoplastic polyimide) is used as a material for the core layer 10. The core layer 10 may contain the non-thermoplastic polyimide at 80 wt % or more, or 90 wt % or more.

The "non-thermoplastic polyimide" is a polyimide that does not soften and have bondability even when heated. Specifically, the "non-thermoplastic polyimide" includes a polyimide that retains its shape without being creased or elongated when a single-layered polyimide is heated at 450° C. for 2 minutes, and a polyimide having substantially no glass transition temperature. The glass transition temperature is a temperature at which a storage elastic modulus measured by a dynamic viscoelasticity measurement apparatus (DMA) reaches an inflection point. The resin material "having substantially no glass transition temperature" refers to one that starts undergoing thermal decomposition before reaching a glass transition state.

Polyimide is generally obtained by preparing a polyimide precursor (polyamic acid) by polymerization of a diamine and a tetracarboxylic dianhydride, dehydrating and ring-closing the polyamic acid to imidize the polyamic acid. In preparation of the non-thermoplastic polyimide, a combination of an aromatic diamine and an aromatic tetracarboxylic dianhydride is suitably used as a monomer.

Examples of the aromatic diamine include 3,3'-diaminodiphenyl ether, 3,4'-diaminodiphenyl ether, 4,4'-diaminodiphenyl ether, 2,2-bis{4-(4-aminophenoxy)phenyl}propane, 2,2-bis{4-(4-aminophenoxy)phenyl}hexafluoropropane, bis{4-(3-aminophenoxy)phenyl}sulfone, bis{4-(4-aminophenoxy)phenyl}sulfone, 1,3-bis(3-aminophenoxy)benzene, 1,3-bis(4-aminophenoxy)benzene, 1,4-bis(4-aminophenoxy)benzene, 3,3'-diaminobenzophenone, 4,4'-diaminobenzophenone, 3,3'-dichlorobenzidine, 3,3'-dimethylbenzidine, 2,2'-dimethylbenzidine, 3,3'-dimethoxybenzidine, 2,2'-dimethoxybenzidine, 1,4-diaminobenzene(p-phenylenediamine), 1,3-diaminobenzene (m-phenylenediamine), 4,4'-diaminodiphenylsulfone, 3,3'-diaminodiphenylsulfone, 9,9-bis(4-aminophenyl)fluorene, 4,4'-(1,4-phenylenebis(1-methylethylidene))bisaniline, phenylenebis(1-methylethylidene))bisaniline, 4,4'-diaminobenzanilide, and 2,2'-dimethylbiphenyl-4,4'-diamine. Two or more aromatic diamines may be used.

Examples of the aromatic tetracarboxylic dianhydride include aromatic tetracarboxylic dianhydrides such as 3,3', 4,4'-benzophenone tetracarboxylic dianhydride, 2,2',3,3'-benzophenone tetracarboxylic dianhydride, 4,4'-oxydiphthalic dianhydride, 3,4'-oxyphthalic dianhydride, ethylene bis(trimellitic acid monoester anhydride), bisphenol A bis (trimellitic acid monoester anhydride), pyromellitic dianhydride, 2,3,6,7-naphthalene tetracarboxylic dianhydride, 1,4, 5,8-naphthalene tetracarboxylic dianhydride, 3,3',4,4'-diphenylsulfone tetracarboxylic dianhydride, 3,3',4,4'-dimethyl diphenylsilane tetracarboxylic dianhydride, 3,3',4, 4'-tetraphenylsilane tetracarboxylic dianhydride, 1,2,3,4-furantetracarboxylic dianhydride, 4,4'-bis(3,4-dicarboxyphenoxy)diphenylpropane dianhydride, 4,4'-hexafluoroisopropylidenediphthalic anhydride, 3,3',4,4'- biphenyltetracarboxylic dianhydride, 2,3,3',4'-biphenyltetracarboxylic dianhydride, p-phenylenebis(trimellitic acid monoester anhydride), and p-phenylenediphthalic anhydride. Two or more aromatic tetracarboxylic dianhydrides may be used.

A polyamic acid can be obtained by reacting substantially equimolar amounts of a diamine and a tetracarboxylic dianhydride. The order of addition, the combination of monomers and the composition are not particularly limited. The organic solvent used for polymerization of the polyamic acid is not particularly limited as long as it dissolves the diamine, the tetracarboxylic dianhydride and the polyamic acid. The organic solvent may be an amide-based solvent such as N,N-dimethylformamide, N,N-diethylformamide, N,N-dimethylacetamide or N-methyl-2-pyrrolidone. The polymerization temperature may be −10° C. to 50° C. The reaction temperature is not particularly limited, and is typically several minutes to several times. The solid content concentration of the polyamic acid solution is typically 5 to 35 wt %, or 10 to 30 wt %.

A polyimide is obtained by imidizing (dehydrating and ring-closing) a polyamic acid as a polyimide precursor. In the imidization, a curing agent may be added to the polyamic acid solution. Examples of the curing agent include dehydrating agents and imidization catalysts. Examples of the dehydrating agent include aliphatic acid anhydrides, aromatic acid anhydrides, N,N'-dialkylcarbodiimides, lower aliphatic halides, halogenated lower aliphatic acid anhydrides, arylsulfonic acid dihalides, and thionyl halides. Examples of the imidization catalyst include aliphatic tertiary amines, aromatic tertiary amines, and heterocyclic tertiary amines.

The core layer may contain a filler in addition to the non-thermosetting polyimide resin. Examples of the material for the filler include silica, titanium oxide, alumina, silicon nitride, boron nitride, calcium hydrogen phosphate, calcium phosphate, and mica.

Thermoplastic Resin Layer

Examples of the material for the thermoplastic resin layers 11 and 12 disposed on both surfaces of the core layer 10 include polycarbonate-based resins, acrylonitrile-styrene copolymer resins, and thermoplastic polyimide-based resins. Among them, thermoplastic polyimide resins are preferable from the viewpoint of heat resistance and adhesion to the core layer. Preferably, the thermoplastic resin layers 11 and 12 contain the thermoplastic polyimide resin at 50 mass % or more.

From the viewpoint of suppressing warpage by matching linear expansion coefficients over the entire multi-layer polyimide film 1 and from the viewpoint of simplifying the production process, it is preferable that the thermoplastic resin layer 11 disposed on one surface (first principal surface) of the core layer 10 and the thermoplastic resin layer 12 disposed on the other surface (second principal surface) of the core layer 10 may have the same composition.

From the viewpoint of adhesion to the metal layer 5 and heat resistance, it is preferable that the thermoplastic polyimide resin layers 11 and 12 may have a glass transition temperature in the range of 150° C. to 320° C. The glass transition temperature of each of the thermoplastic polyimide resin layers 11 and 12 may be 200° C. to 300° C.

Similarly to the non-thermosetting polyimide, the thermoplastic polyimide is obtained by dehydrating and ring-closing a polyamic acid as a polyimide precursor. In preparation of the thermoplastic polyimide, a combination of an aromatic diamine and an aromatic tetracarboxylic dianhydride is suitably used as a monomer. Various properties of the polyimide can be adjusted by selection from a diamine and a tetracarboxylic dianhydride.

In general, if the ratio of the aromatic diamine having a rigid structure increases, the glass transition temperature increases, and accordingly, the storage elastic modulus at a high temperature tends to increase, leading to deterioration of adhesion and processability. Examples of the composition of the thermoplastic polyimide resin include those in which benzophenone tetracarboxylic dianhydride, biphenyltetracarboxylic dianhydride, oxydiphthalic dianhydride, biphenylsulfone tetracarboxylic dianhydride, or the like is used as the tetracarboxylic dianhydride, and an aromatic diamine having an aminophenoxy group is used as the diamine. The ratio of the aromatic diamine having a rigid structure in the diamine used for preparation of the thermoplastic polyimide may be 40 mol % or less, 30 mol % or less, or 20 mol % or less.

Preparation of Multi-Layer Polyimide Film

The method for producing the multi-layer polyimide film 1 including the thermoplastic resin layers 11 and 12 on both surfaces of the core layer 10 is not particularly limited. Examples of the method include a method in which the thermoplastic resin layers are sequentially or simultaneously formed on both surfaces of the core layer 10; and a method in which a material for the core layer 10 and a material for the thermoplastic resin layers 11 and 12 are subjected to multi-layer co-extrusion from a multi-layer die.

A polyimide obtained by imidization of a polyamic acid obtained by polymerization of an aromatic diamine and an aromatic tetracarboxylic dianhydride has low solubility in an organic solvent after the imidization. Therefore, in the formation of the core layer 10 and the thermoplastic resin layers 11 and 12, it is preferable to perform imidization after forming a polyamic acid solution (polyimide precursor) into a film shape.

When a multi-layer polyimide film is produced by multi-layer co-extrusion, it is preferable that a polyamic acid solution as a precursor of a non-thermoplastic polyimide precursor for forming the core layer 10 and a polyamic acid solution as a precursor of a thermoplastic polyimide for forming the thermoplastic resin layers 11 and 12 are applied in a film shape onto a support substrate by three-layer co-extrusion, heated to remove the solvent if necessary, and then further heated to perform imidization. As described above, a curing agent may be added to the polyamic acid solution in order to promote imidization. In the case of three-layer co-extrusion, a curing agent may be added only to the polyimide precursor of the core layer 10, or a curing agent may be added to the polyimide precursor of the core layer 10 and the polyimide precursors of the thermoplastic resin layers 11 and 12. The polyimides of the core layer 10 and the thermoplastic resin layers 11 and 12 may be completely imidized, or may contain a non-imidized structure (ring-opened polyamic acid) in part.

The thickness of the core layer 10 and the thicknesses of each of the thermoplastic resin layers 11 and 12 are not particularly limited, and it is preferable to adjust the thickness balance in consideration of the linear expansion coefficient and the like of each layer so that the multi-layer polyimide film 1 is not warped.

The thickness of the core layer 10 may be 3 to 50 μm, or 5 to 40 μm. The thickness of each of the thermoplastic resin layers 11 and 12 may be 0.5 to 15 μm, or 1 to 10 μm. The thicknesses of each of the thermoplastic resin layers 11 and 12 disposed on both surfaces of the core layer 10 may be the same or different. From the viewpoint of suppressing warpage, the difference between the thickness of the thermoplastic resin layer 11 and the thickness of the thermoplastic resin layer 12 may be small. The ratio of the thickness of the thermoplastic resin layer 11 to the thickness of the thermoplastic resin layer 12 may be 0.7 to 1.3, 0.8 to 1.2, or 0.9 to 1.1.

The thickness of each of the thermoplastic resin layers 11 and 12 may be 0.05 to 0.5 times, and may be 0.1 to 0.4 times the thickness of the core layer 10. The thickness of the entire multi-layer polyimide film 1 may be 4 to 65 μm, or 5 to 55 μm.

A commercially available product may be used as the multi-layer polyimide film including the thermoplastic resin layers on both surfaces of the core layer. Examples of the polyimide film having a three-layer configuration with a thermoplastic polyimide layer disposed on each of both surfaces of the core layer of the non-thermoplastic polyimide include "PIXIO" manufactured by Kaneka Corporation.

Surface Layer

The laminate 101 is obtained by forming the surface layer 2 on the thermoplastic resin layer 12 on one surface of the multi-layer polyimide film 1. Since the surface layer 2 is provided, the thermoplastic resin layer 12 is prevented from being exposed, so that it is possible to suppress a problem caused by fusion of the thermoplastic resin layer 12 during thermal lamination for laminating the metal layer 5 onto the thermoplastic resin layer 11 and during heating of the printed wiring board in the production process.

The surface layer 2 may be one that is not softened and does not have bondability during thermal lamination of the metal foil or thermal lamination for laminating the metal layer 5 onto the thermoplastic resin layer 11 and during heating of the printed wiring board in the production process. The surface layer 2 may be an inorganic layer or an organic layer (resin layer) as long as it has the heat resistance. From the viewpoint of suppressing warpage of the laminate 101 and the single-sided metal-clad laminate 105, the thickness of the surface layer 2 may be 5 μm or less. When the surface layer 2 is an inorganic layer, the thickness may be 1 to 200 nm. When the surface layer is a resin layer, the thickness thereof may be 0.1 to 5 μm.

Surface Layer

Examples of the inorganic material of the surface layer 2 include metals such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Co, Rh, Ir, Pd, Pt, Cu, Ag, Au, Zn and Cd, alloys thereof, and ceramic materials such as nitrides, oxides and oxynitrides.

In the single-sided metal-clad laminate and the printed wiring board using the single-sided metal-clad laminate, the surface layer 2 is laminated integrally on the thermoplastic resin layer 12 as it is. Therefore, the surface layer 2 may be an insulating material, and the material for the inorganic surface layer may be a ceramic material. A ceramic material is also preferable from the viewpoint of chemical stability and mechanical strength.

Among the ceramic materials, oxides are preferable, and silicon oxide is particularly preferable, from the viewpoint of insulation quality, heat resistance and chemical stability. The silicon oxide may be silicon dioxide ($SiO_2$) having a stoichiometric composition, or $SiO_x$ ($0<x<2$) in which the ratio of oxygen is lower than that in the stoichiometric composition. Silicon oxide having a non-stoichiometric composition is preferable because of excellent stiffness. In the silicon oxide having a non-stoichiometric composition: $SiO_x$, x may be about 1.2 to 1.95, and may be about 1.2 to 1.9 or about 1.3 to 1.8.

As described above, the thickness of the inorganic surface layer may be 1 to 200 nm. When the thickness is 1 nm or more, the entire surface of the thermoplastic resin layer 12 can be uniformly covered. When the thickness is 200 nm or less, warpage is suppressed, and the inorganic surface layer tends to have excellent flexibility, leading to suppression of generation of breaks and cracks. From the viewpoint of reliably covering the entire surface of the thermoplastic resin layer 12, the thickness of the inorganic surface layer may be 2 nm or more, or 3 nm or more, and may be 5 nm or more or 10 nm or more. From the viewpoint of suppressing breaks and cracks, the thickness of the inorganic surface layer may be 150 nm or less, or 100 nm or less, and may be 80 nm or less or 50 nm or less.

The method for forming the inorganic surface layer is not particularly limited, and dry coating such as a sputtering method, a vacuum vapor deposition method, an ion plating method, or a CVD method is preferable because a uniform film is easily formed.

Resin Surface Layer

The resin material for the surface layer 2 is not particularly limited as long as it has the heat resistance, and the resin material may be either a thermoplastic resin or a non-thermoplastic resin, or may be a blended resin material of a thermoplastic resin and a non-thermoplastic resin. The resin surface layer may be formed by thermal curing or photocuring.

When the surface layer 2 is a thermoplastic resin layer, it is preferable that the resin surface layer 2 has a higher glass transition temperature over the thermoplastic resin layer 12 of the multi-layer polyimide film 1 from the viewpoint of suppressing softening and fusion by heating. The glass transition temperature of the surface layer 2 may be higher than the glass transition temperature of the thermoplastic resin layer 12 by 10° C. or more, or 15° C. or more. The glass transition temperature of the surface layer that is a thermoplastic resin layer may be 200° C. or higher, 250° C. or higher, and may be 280° C. or higher or 300° C. or higher.

As a thermoplastic resin having a high glass transition temperature as described above, a polyimide is suitably used. When the surface layer 2 is a thermoplastic polyimide resin layer, a thermoplastic polyimide having a higher glass transition temperature can be prepared by making the ratio of a rigid aromatic monomer higher than that of a polyimide for forming the thermoplastic resin layer 12 of the multi-layer polyimide film 1.

When the surface layer 2 is a non-thermoplastic resin layer, a non-thermoplastic polyimide is suitably used because it has high heat resistance. The non-thermoplastic polyimide is as described above as a material for the core layer 10. When the surface layer 2 is a non-thermoplastic polyimide resin layer, the composition of the core layer 10 and the composition of the surface layer 2 may be the same or different.

As described above, the resin material for the surface layer 2 may be a blended resin material of a thermoplastic resin and a non-thermoplastic resin. The ratio between the thermoplastic resin and the non-thermoplastic resin may be adjusted in consideration of the heat resistance and the like of the surface layer.

The resin material of the surface layer 2 may be a thermosetting resin such as an epoxy-based resin or an acryl-based resin. From the viewpoint of heat resistance, the thermosetting resin of the surface layer 2 may be in a cured state (state after thermal curing).

From the viewpoint of suppressing fusion and blocking, the surface layer 2 that is a resin layer may be one on which surface irregularities are formed by adding an inorganic or organic filler.

As described above, the thickness of the resin surface layer may be 0.1 to 5 µm. When the thickness is 0.1 µm or more, the entire surface of the thermoplastic resin layer 12 can be uniformly covered. When the thickness is 5 µm or less, warpage tends to be suppressed. From the viewpoint of reliably covering the entire surface of the thermoplastic resin layer 12, the thickness of the resin surface layer may be 0.2 µm or more, and may be 0.3 µm or more. From the viewpoint of suppressing warpage, the thickness of the inorganic surface layer may be 4 µm or less, 3 µm or less, and may be 2 µm or less, 1.5 µm or less, or 1 µm or less.

The method for forming the resin surface layer is not particularly limited. For example, the resin surface layer 2 can be formed by coating the thermoplastic resin layer 12 of the multi-layer polyimide film 1 with a resin solution, and removing the solvent by performing heating if necessary. In preparation of the multi-layer polyimide film, a laminate including the resin surface layer 2 may be formed by multi-layer co-extrusion of four layers with the surface layer 2 added to the three layers: thermoplastic resin layer 11, core layer 10 and thermoplastic resin layer 12.

When the resin material is a polyimide, imidization by heating may be performed after a polyamic acid solution (polyimide precursor) is applied as a resin solution. When the resin material is a thermosetting resin or a photocurable resin, the resin material may be cured by heating or irradiation with an active ray.

The surface layer 2 may be formed on the thermoplastic resin layer 12 after the metal layer 5 is laminated on the thermoplastic resin layer 11 of the multi-layer polyimide film 1. For example, when the surface layer 2 has surface irregularities from the filler, the irregularity shape can be maintained by laminating the metal layer 5 by thermal lamination, and then forming the surface layer 2, so that it is possible to contribute to suppression of fusion of the metal layer-non-formed surface and blocking in production of a printed wiring board using the single-sided metal-clad laminate.

Action of Surface Layer

In the printed wiring board, the surface layer 2 is a layer integrally laminated on the thermoplastic resin layer 12 as it is, regardless of whether the surface layer 2 is an inorganic layer or a resin layer. In the multi-layer printed wiring board, (a wiring layer of) another wiring board is bonded to the surface of the surface layer 2 with an adhesive sheet such as a bonding sheet interposed therebetween. In other words, even after the metal layer 5 is laminated onto the thermoplastic resin layer 11, the surface layer 2 is present as it is in the printed wiring board without being peeled off from the thermoplastic resin layer 12. From the viewpoint of reducing the thickness of the printed wiring board, the thickness of surface layer 2 may be as small as possible as long as the surface of the thermoplastic resin layer 12 can be protected to suppress fusion or the like.

As long as the surface layer 2 is provided, the thermoplastic resin layer 12 does not contact an adhesive sheet such as a bonding sheet when a multi-layer printed wiring board is produced using a single-sided metal-clad laminate. Therefore, even if the thermoplastic resin layer 12 is softened by heating in thermal pressing or the like, and thus exhibits bondability, fusion between the thermoplastic resin layer 12 and the adhesive sheet can be prevented. Therefore, when processing such as boring is performed, the workpiece (cut piece) can be easily removed.

Single-Sided Metal-Clad Laminate

The single-sided metal-clad laminate 105 is formed by laminating the metal layer 5 onto the thermoplastic resin layer 11 on a surface of the laminate 101 where the surface layer 2 is not provided. As described above, the surface layer 2 may be formed on the thermoplastic resin layer 12 after the metal layer 5 is laminated on the thermoplastic resin layer 11.

The metallic material for the metal layer 5 may be copper or a copper alloy, stainless steel or an alloy thereof, nickel or a nickel alloy (including the 42 alloy), aluminum or an aluminum alloy, or the like because it has high conductivity. The metal layer 5 may be a metal foil because it is easily laminated, and a copper foil such as a rolled copper foil or an electrolytic copper foil is preferable as in a general flexible printed wiring board. A rustproof layer, a heat resistant layer, an adhesive layer, and the like may be disposed on the surface of the metal foil. The thickness of the metal layer 5 is not particularly limited, and may be selected according to the configuration of a printed wiring board and required conductivity. The thickness of the metal layer 5 is, for example, 3 to 30 µm, or 5 to 20 µm.

The method for laminating the metal layer 5 on the thermoplastic resin layer 11 is not particularly limited, and thermocompression bonding is preferable because generation of creases during lamination can be suppressed. Examples of the thermocompression bonding include batch thermocompression bonding by single plate pressing, continuous treatment using a double belt press (DBP) apparatus, and thermal lamination by a heat roll. From the viewpoint of productivity, a method is preferable in which a metal foil is laminated onto the thermoplastic resin layer 11 by a roll-to-roll system using a heat roll laminator including a metal nip roll for heating and pressurizing a material.

During thermocompression bonding, a protective film may be interposed between a pressurization body such as a heat roll and a material to be laminated for the purpose of, for example, preventing generation of creases and fusion of the resin material to the heat roll. When the metal layer 5 is laminated onto the thermoplastic resin layer 11 of the laminate 101 by thermal lamination, the protective film may be interposed between the metal layer 5 (metal foil) and the heat roll, or may be interposed between the surface layer 2 of the laminate 101 and the heat roll. A protective film may be interposed between the metal layer 5 and the heat roll and between the laminate 101 and the heat roll. In the laminate 101, the surface layer 2 is provided on the thermoplastic resin layer 12 in advance, so that fusion of the thermoplastic resin layer 12 to the protective film can be prevented, and the protective film is easily peeled off even after thermal lamination.

The protective film is not particularly limited as long as it can withstand the heating temperature during thermocompression bonding, and a heat-resistant resin film such as a non-thermoplastic polyimide film, or a metal foil such as a copper foil, an aluminum foil or a SUS foil is suitably used. Among them, a non-thermoplastic polyimide film is particularly preferable from the viewpoint of heat resistance, recyclability, and the like. From the viewpoint of handleability and prevention of creases during lamination, the thickness of the protective film may be 25 to 300 or 50 to 250 and may be 75 to 200 μm.

When a non-thermoplastic polyimide film is used as the protective film, various known films can be used, and for example, commercially available polyimide films such as "APICAL" series manufactured by Kaneka Corporation, "UPILEX" series manufactured by Ube Industries, Ltd., and "KAPTON" series manufactured by DU PONT-TORAY CO., LTD. may be used.

Printed Wiring Board

The single-sided metal-clad laminate is suitably used for producing a flexible printed wiring board (FPC). FPC may be a multi-layer printed wiring board in which a plurality of wiring layers are laminated with insulating layers interposed between the wiring layers. In the multi-layer printed wiring board, the multi-layer polyimide film 1 having the thermoplastic resin layers 11 and 12 disposed on both surfaces of the core layer 10, and the surface layer 2 serve as insulating layers between the plurality of wiring layers.

The wiring layer (first wiring layer) is formed by patterning the metal layer 5 of the single-sided metal-clad laminate 105. A multi-layer is formed by laminating the single-sided wiring substrate with a substrate including another wiring layer (second wiring layer). For example, a surface on the surface layer 3-side (wiring layer-non-formed surface) of a single-sided metal-clad laminate including a first wiring layer, in which the metal layer 5 is patterned, is bonded to a wiring layer (second wiring layer) of another substrate to form a multi-layer. The surface layer and the wiring layer of the other substrate may be bonded to each other with an adhesive sheet such as a bonding sheet interposed therebetween.

In the production process of the multi-layer printed wiring board, the lamination of one layer to another is performed by, for example, thermal pressing. In the production process of a multi-layer printed wiring board, boring may be performed by punching, mechanical drilling, laser processing or the like before and after formation of a multi-layer for the purpose of, for example, conduction of metal wirings. There is a possibility that during such processing, a processed portion and the periphery thereof are subjected to high temperature, so that the thermoplastic resin layer 12 disposed on the surface of the core layer 10 is softened and thus exhibits bondability.

In the single-sided metal-clad laminate 105, the surface layer 3 is provided so as to contact the thermoplastic resin layer 12, and therefore even if the thermoplastic resin layer 12 is softened by heat, fusion of the thermoplastic resin layer 12 to a bonding sheet or a wiring layer of another substrate can be prevented. Therefore, processing failure caused by fusion of the thermoplastic resin layer 12 or insufficient removal of processed pieces (cut pieces) in boring is suppressed, so that processability and handleability are improved, and it is possible to contribute to improvement of the yield.

EXAMPLES

Hereinafter, one or more embodiments of the present invention will be described in more detail by showing examples, but one or more embodiments of the present invention are not limited to the following examples.

Example 1

Formation of Surface Layer

As a multi-layer polyimide film, a multi-layer polyimide film ("PIXIO SR" manufactured by Kaneka Corporation) was used which had a three-layer configuration in which a thermoplastic polyimide layer (thickness: 8 μm) having a glass transition temperature of 290° C. was disposed on each of both surfaces of a non-thermoplastic polyimide layer (thickness 34 μm). A SiOx layer (x≈1.5) having a thickness of 20 nm was formed as a surface layer on the thermoplastic polyimide layer on one surface of the multi-layer polyimide film by a sputtering method to obtain a laminate.

Lamination of Copper Foil

A 12 μm-thick rolled copper foil ("GHIY 5-82F-HA" manufactured by JX Nippon Mining & Metals Corporation) was superposed on the thermoplastic polyimide layer on a surface layer-non-formed surface of the laminate. A 125 μm-thick non-thermoplastic polyimide film ("APICAL 125 NPI" manufactured by Kaneka Corporation) as a protective film was disposed on each of both surfaces of this sample, and thermal lamination was performed under the conditions of a lamination temperature of 360° C., a lamination pressure of 245 N/cm and a lamination speed of 1 m/min to produce a single-sided metal-clad laminate including a protective film on each of both surfaces. The single-sided copper-clad laminate had a laminated configuration in which a copper foil was laminated on one surface of a polyimide film having a three-layer structure and a surface layer was provided on the other surface.

Example 2

The thickness of the SiOx layer as a surface layer was changed to 80 nm. Except for the above, the same procedure as in Example 1 was carried out to obtain a single-sided copper-clad laminate.

Example 3

Preparation of Precursor of Thermoplastic Polyimide

With the reaction system maintained at 20° C., 74.18 g of 2,2'-bis[4-(4-aminophenoxy)phenyl]propane (BAPP) was added to 636.07 g of N,N-dimethylformamide (DMF), and 10.63 g of 3,3',4,4'-biphenyltetracarboxylic dianhydride (BPDA) was slowly added with stirring in a nitrogen atmosphere. It was confirmed by visual observation that BPDA had been dissolved, 30.48 g of pyromellitic dianhydride (PMDA) was then added, and the mixture was stirred for 30 minutes. Subsequently, 6.51 g of 1,4 phenylenediamine (PDA) was added thereto, 12.09 g of PMDA was added with stirring, and the mixture was stirred for 30 minutes. Further, a solution obtained by dissolving 2.1 g of PMDA in DMF at a solid content concentration of 7% was slowly added to the reaction solution. Thereafter, stirring was continued until the viscosity reached 800 poise, thereby obtaining a thermoplastic polyimide precursor (polyamic acid solution).

Formation of Surface Layer

The precursor of a thermoplastic polyimide was applied by a spin coater onto a thermoplastic polyimide layer on one surface of a multi-layer polyimide film ("PIXIO SR" manufactured by Kaneka Corporation) having a three-layer structure, the solvent was removed by heating, and heating was then carried out at 330° C. for 3 minutes to perform imidization, thereby forming a 0.5 μm-thick surface layer (glass transition temperature: 305° C.) of thermoplastic polyimide resin.

Lamination of Copper Foil

A 12 μm-thick rolled copper foil was laminated onto the thermoplastic polyimide layer on a surface layer-non-formed surface of the laminate in the same manner as in Example 1 to produce a single-sided copper-clad laminate.

Example 4

Preparation of Precursor of Non-Thermoplastic Polyimide

With the reaction system maintained at 20° C., 25.1 g of 4,4'-oxydiamine (4,4'-ODA) and 5.8 g of PDA were added to 930.07 g of DMF, the mixture was stirred for 40 minutes in a nitrogen atmosphere, and a solution obtained by dissolving 1.3 g of PMDA in DMF at a solid content concentration of 7% was then slowly added to the reaction solution. Thereafter, stirring was continued until the viscosity reached 800 poise, thereby obtaining a non-thermoplastic polyimide precursor (polyamic acid solution).

Formation of Surface Layer and Lamination of Copper Foil

Except that the non-thermoplastic polyimide precursor was used, the same procedure as in Example 3 was carried out to produce a single-sided copper-clad laminate, where a 0.5 μm-thick surface layer of non-thermoplastic polyimide resin was formed on one surface of a multi-layer polyimide film and a rolled copper foil was laminated to a surface layer-non-formed surface.

Example 5

The thermoplastic polyimide precursor prepared in Example 3 and the non-thermoplastic polyimide precursor prepared in Example 4 were mixed at a weight ratio of 1:1 to prepare a mixed solution of polyimide precursors. Except that the mixed solution was used as a polyimide precursor, the same procedure as in Example 3 was carried out to produce a single-sided copper-clad laminate, where a 0.5 μm-thick surface layer of polyimide resin was formed on one surface of a multi-layer polyimide film and a rolled copper foil was laminated to a surface layer-non-formed surface.

Example 6

A thermosetting epoxy resin composition containing a phenol resin curing agent was applied by a spin coater onto a thermoplastic polyimide layer on one surface of a multi-layer polyimide film ("PIXIO SR" manufactured by Kaneka Corporation) having a three-layer structure, the solvent was removed by heating, and heating was then carried out at 180° C. for 30 minutes to perform heat curing, thereby forming a 0.5 μm-thick epoxy resin layer (surface layer). A 12 μm-thick rolled copper foil was laminated onto the thermoplastic polyimide layer on a surface layer-non-formed surface of the laminate in the same manner as in Example 1 to produce a single-sided copper-clad laminate.

Comparative Example 1

A copper foil was superposed on one surface of a multi-layer polyimide film ("PIXIO SR" manufactured by Kaneka Corporation), and 125 μm-thick non-thermoplastic polyimide film ("APICAL 125 NPI" manufactured by Kaneka Corporation) as a protective film was disposed on each of both surfaces of this sample, and the copper foil was thermally laminated under the same conditions as in Example 1 to produce a single-sided copper-clad laminate.

Comparative Example 2

The thickness of the SiOx layer as a surface layer was changed to 220 nm. Except for the above, the same procedure as in Example 1 was carried out to obtain a single-sided copper-clad laminate.

Comparative Example 3

Except that the thickness of the surface layer (thermoplastic polyimide resin layer) was 7 μm, the same procedure as in Example 3 was carried out to produce a single-sided copper-clad laminate in which a 7 μm-thick surface layer of thermoplastic polyimide resin was provided on one surface of a multi-layer polyimide film and a copper foil was laminated on the other surface.

Evaluation

Adhesion

Adhesion Between Surface Layer and Protective Film

The single-sided metal-clad laminate obtained in each of Examples 1 to 6 and Comparative Examples 1 to 3 and including a protective film on each of both surfaces was cut to a size of 1 cm in width and 10 cm in length, and the peel strength of a protective film (polyimide film) on a copper foil-free surface (surface layer-formed surface) was measured under the condition of peeling speed: 100 mm/min using a tensile tester.

Adhesion of Copper Foil Thermal Pressed to Surface Layer

A 12 μm-thick rolled copper foil (GHY5-82 F-HA manufactured by JX Nippon Mining & Metals Corporation) was superposed on a copper foil-free surface of the single-sided copper-clad laminate after the protective films on both surfaces were peeled off, and thermal pressing was performed for 60 minutes under the conditions of a temperature of 250° C. and a pressure of 3 MPa. This sample was cut to a size of 1 cm in width and 10 cm in length, and the peel strength of the copper foil laminated on the surface layer by thermal pressing was measured under the same conditions as described above.

Warpage

The laminate before bonding the copper foil (laminate in which a surface layer is formed on one surface of a multi-layer polyimide film having a three-layer configuration) was cut to a square of 5 cm×5 cm, and allowed to stand on a horizontal table with the surface layer-formed surface on the upper side. The distances of the four vertexes of the square from the table (amount of elevation) were measured, and the average value thereof was taken as the amount of warpage. The single-sided copper-clad laminate was allowed to stand on a horizontal table with the copper foil-bonded surface on the upper side, and the same evaluation was performed.

Breaks of Surface Layer

A surface of the single-sided copper-clad laminate on the surface layer-side was observed with an optical microscope (magnification: 200 times) to confirm whether or not breaks were present in the surface layer.

Table 1 shows the materials and thicknesses of the surface layers in Examples and Comparative Examples, and the results of evaluation of the single-sided copper-clad laminates.

TABLE 1

| | Surface layer | | Adhesion (N/10 mm) | | | Warpage (mm) | | Break in |
| | Material | Thickness (nm) | Protective film | Copper foil | Film | Single-sided copper-clad laminate | | surface layer |
|---|---|---|---|---|---|---|---|---|
| Example 1 | SiOx | 20 | <0.1 | <0.1 | 1 | 1 | | Not present |
| Example 2 | SiOx | 80 | <0.1 | <0.1 | 1 | 1 | | Not present |
| Example 3 | Thermoplastic PI | 500 | <0.1 | <0.1 | 1 | 1 | | Not present |
| Example 4 | Non-thermoplastic PI | 500 | <0.1 | <0.1 | 2 | 1 | | Not present |
| Example 5 | Thermoplastic PI/non-thermoplastic PI | 500 | <0.1 | <0.1 | 1 | 1 | | Not present |
| Example 6 | Epoxy resin | 500 | <0.1 | <0.1 | 2 | 2 | | Not present |
| Comparative Example 1 | — | — | 0.3 | 0.7 | 1 | 12 | | — |
| Comparative Example 2 | SiOx | 220 | <0.1 | <0.1 | 1 | 2 | | Present |
| Comparative Example 3 | Thermoplastic PI | 7000 | <0.1 | <0.1 | 13 | 14 | | Not present |

In Comparative Example 1 where a copper foil was laminated without forming a surface layer, the protective film had higher adhesion and inferior peelability as compared to other examples. In addition, adhesion between the thermoplastic resin layer of the multi-layer polyimide film having a three-layer configuration and the copper foil is high, so that there is a risk of blocking in the production process of the printed wiring board and processing failure during processing such as boring.

On the other hand, in Example 1 to 6 in where the surface layer was provided on the thermoplastic resin layer on one surface of the multi-layer polyimide film having a three-layer configuration and the copper foil was laminated on the other surface, the surface layer and the protective film was easily peeled from each other because adhesion therebetween was low, and the surface layer had small adhesion to the copper foil. In Comparative Example 1, warpage (curling) with the copper foil-side surface on the inner side occurred after the copper foil was bonded, whereas in Example 1 to 6, there was little warpage in the single-sided copper-clad laminate, and good characteristics were exhibited.

In Comparative Example 2 where a SiOx layer having a thickness of 220 nm was formed as the surface layer, there were breaks in the SiOx layer. Comparison of Examples 1 and 2 with Comparative Example 2 shows that breaks in the surface layer can be suppressed by reducing the thickness of the inorganic surface layer.

In Comparative Example 3 where a 7 μm-thick thermoplastic polyimide layer was formed as the surface layer, curling with the surface layer-side on the inner side occurred after formation of the surface layer, and warpage with the copper foil-side surface on the inner side occurred as in Comparative Example 1 after the copper foil was bonded to a surface layer-non-formed surface. Comparison of Example 3 and the like with Comparative Example 3 shows that by reducing the thickness of the resin surface layer, warpage of the substrate (single-sided copper-clad laminate) after formation of the surface layer and after bonding of the copper foil can be reduced.

DESCRIPTION OF REFERENCE SIGNS

1 Multi-layer polyimide film
10 Core layer (non-thermoplastic polyimide film)
11, 12 Thermoplastic resin layer
2 Surface layer
101 Laminate
5 Metal layer
105 Single-sided metal-clad laminate Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

The invention claimed is:
1. A laminate comprising:
a multi-layer polyimide film including a non-thermoplastic polyimide film having a first principal surface and a second principal surface, a first thermoplastic polyimide layer disposed on the first principal surface of the non-thermoplastic polyimide film, and a second thermoplastic polyimide layer disposed on the second principal surface of the non-thermoplastic polyimide film; and
a surface layer contacting the second thermoplastic polyimide layer of the multi-layer polyimide film, wherein the surface layer is an inorganic layer having a thickness of 1 to 200 nm.

2. The laminate according to claim 1, wherein the surface layer is a ceramic layer having a thickness of 1 to 200 nm.

3. The laminate according to claim 1, wherein the surface layer is a silicon oxide layer having a thickness of 1 to 200 nm.

4. The laminate according to claim 1, wherein the first thermoplastic polyimide layer and the second thermoplastic polyimide layer have a same composition.

5. A comprising:
a multi-layer polyimide film including a non-thermoplastic polyimide film having a first principal surface and a second principal surface, a first thermoplastic polyimide layer disposed on the first principal surface of the non-thermoplastic polyimide film, and a second thermoplastic polyimide layer disposed on the second principal surface of the non-thermoplastic polyimide film; and
a surface layer contacting the second thermoplastic polyimide layer of the multi-layer polyimide film,
wherein the surface layer is a thermoplastic resin layer having a thickness of 0.1 to 5 μm, and the surface layer has a glass transition temperature that is higher than a glass transition temperature of the second thermoplastic resin layer.

6. The laminate according to claim 5, wherein the thermoplastic resin layer is a thermoplastic polyimide layer having a thickness of 0.1 to 5 μm.

7. A laminate comprising:
a multi-layer polyimide film including a non-thermoplastic polyimide film having a first principal surface and a second principal surface, a first thermoplastic polyimide layer disposed on the first principal surface of the non-thermoplastic polyimide film, and a second thermoplastic polyimide layer disposed on the second principal surface of the non-thermoplastic polyimide film; and
a surface layer contacting the second thermoplastic polyimide layer of the multi-layer polyimide film,
wherein the surface layer is a non-thermoplastic resin layer having a thickness of 0.1 to 5 μm.

8. The laminate according to claim 7, wherein the non-thermoplastic resin layer is a non-thermoplastic polyimide layer having a thickness of 0.1 to 5 μm.

9. A laminate comprising:
a multi-layer polyimide film including a non-thermoplastic polyimide film having a first principal surface and a second principal surface, a first thermoplastic polyimide layer disposed on the first principal surface of the non-thermoplastic polyimide film, and a second thermoplastic polyimide layer disposed on the second principal surface of the non-thermoplastic polyimide film; and
a surface layer contacting the second thermoplastic polyimide layer of the multi-layer polyimide film,
wherein the surface layer is a thermosetting resin layer having a thickness of 0.1 to 5 μm.

10. A single-sided metal-clad laminate comprising:
a laminate; and
a metal foil,
wherein the laminate comprises:
a multi-layer polyimide film including a non-thermoplastic polyimide film having a first principal surface and a second principal surface, a first thermoplastic polyimide layer disposed on the first principal surface of the non-thermoplastic polyimide film, and a second thermoplastic polyimide layer disposed on the second principal surface of the non-thermoplastic polyimide film; and
a surface layer contacting the second thermoplastic polyimide layer of the multi-layer polyimide film,
wherein the surface layer is an inorganic layer having a thickness of 1 to 200 nm or a resin layer having a thickness of 0.1 to 5 μm,
wherein the metal foil is arranged to contact the first thermoplastic polyimide layer of the laminate, and
wherein the single-sided metal-clad laminate has the metal foil only on the first thermoplastic polyimide layer and does not have a metal foil on the surface layer of the laminate.

11. A multi-layer printed wiring board in which a plurality of wiring layers are laminated with an insulating layer, interposed between the plurality of wiring layers, the multi-layer printed wiring board comprising:
the single-sided metal-clad laminate according to claim 10, and
another layer bonded to the surface layer of the laminate of the single-sided metal-clad laminate to form a multi-layer,
wherein the metal foil of the single-sided metal-clad laminate, which is a first wiring layer, is patterned.

12. The multi-layer printed wiring board according to claim 11, wherein the another layer is a second wiring layer that is bonded to the surface layer of the laminate of the single-sided metal-clad laminate with an adhesive sheet interposed therebetween.

13. The single-sided metal-clad laminate according to claim 10, wherein the surface layer is a ceramic layer having a thickness of 1 to 200 nm.

14. The single-sided metal-clad laminate according to claim 10, wherein the surface layer is a silicon oxide layer having a thickness of 1 to 200 nm.

15. The single-sided metal-clad laminate according to claim 10, wherein the surface layer is a thermoplastic resin layer having a thickness of 0.1 to 5 μm, and the surface layer has a glass transition temperature that is higher than a glass transition temperature of the second thermoplastic resin layer.

16. The single-sided metal-clad laminate according to claim 10, wherein the surface layer is a non-thermoplastic resin layer having a thickness of 0.1 to 5 μm.

17. The single-sided metal-clad laminate according to claim 10, wherein the surface layer is a thermosetting resin layer having a thickness of 0.1 to 5 μm.

* * * * *